United States Patent
Huppert et al.

(10) Patent No.: US 6,426,268 B1
(45) Date of Patent: Jul. 30, 2002

(54) THIN FILM RESISTOR FABRICATION METHOD

(75) Inventors: Gilbert L. Huppert, Stoneham; Michael D. Delaus, Andover, both of MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 09/950,219

(22) Filed: Sep. 7, 2001

Related U.S. Application Data

(60) Provisional application No. 60/250,595, filed on Nov. 28, 2000.

(51) Int. Cl.[7] .................................................. H01L 21/20
(52) U.S. Cl. ....................... 438/384; 438/382; 438/383; 438/385; 438/238
(58) Field of Search ................................. 438/382–385, 438/238

(56) References Cited

U.S. PATENT DOCUMENTS

| | | | | |
|---|---|---|---|---|
| 4,878,770 A | | 11/1989 | Ruggierio et al. .......... 388/308 |
| 5,043,295 A | | 8/1991 | Ruggierio et al. ............. 437/47 |
| 5,420,063 A | * | 5/1995 | Maghsoudnia et al. ... 148/DIG. 136 |
| 5,479,316 A | | 12/1995 | Smrtic et al. ................ 361/322 |
| 5,705,418 A | * | 1/1998 | Liu ............................ 438/238 |
| 5,710,070 A | * | 1/1998 | Chan ........................... 347/59 |
| 5,926,359 A | | 7/1999 | Greco ......................... 361/311 |
| 5,943,566 A | * | 8/1999 | Wang ................. 148/DIG. 163 |
| 6,211,032 B1 | * | 4/2001 | Redford et al. ............. 438/384 |
| 6,274,452 B1 | * | 8/2001 | Miura et al. ................ 438/382 |

FOREIGN PATENT DOCUMENTS

| | | | | |
|---|---|---|---|---|
| JP | 01073659 A | * | 3/1989 | ........... H01L/27/04 |

\* cited by examiner

Primary Examiner—John F. Niebling
Assistant Examiner—Jennifer M. Kennedy
(74) Attorney, Agent, or Firm—Koppel, Jacobs, Patrick & Heybl

(57) ABSTRACT

A thin film resistor fabrication method requires that an IC's active devices be fabricated on a substrate, and a dielectric layer be deposited over the devices to protect them from subsequent process steps. A layer of thin film material is deposited next, followed by a barrier layer and a first layer of metal. These three layers are patterned and etched to form isolated material stacks wherever a TFR is to be located, and a first level of metal interconnections. The first metal layer is removed from the TFR stacks, and the barrier layer is patterned and etched to provide respective openings which define the active areas of each TFR. In a preferred embodiment, a dielectric layer is deposited after the first metal layer is removed, to protect the interconnect metal from corrosion and as an adhesion layer for the patterning of the openings which define resistor length. Once the TFRs are completed, a dielectric layer is preferably deposited, vias to the first layer of metal are patterned and etched, and a second metal layer is deposited, patterned and etched to provide a second layer of metal interconnections.

13 Claims, 5 Drawing Sheets

THIN FILM RESISTOR FABRICATION METHOD

This application claims the benefit of provisional patent application No. 60/250,595 to Huppert et al., filed Nov. 28, 2000.

BACKGROUND OF THE INVENTION

1. Field of the Invention

This invention relates to the field of integrated circuit (IC) fabrication, and particularly to the fabrication of thin film resistors.

2. Description of the Related Art

The ability to integrate high accuracy passive components such as resistors with active devices has become increasingly important. Resistors made from a thin film material have traditionally been employed in Do this context, because they are simple and inexpensive to fabricate.

Conventionally, when thin film resistors (TFRs) are fabricated, they are in contact with the IC's first level of metallization. This results in different TFRs being at different effective electrical potentials. The effectiveness of a majority of wet etchants is affected by the potential of the material being etched. Therefore, by being at different potentials, the sizes and resistivities of an IC's TFRs can be affected unequally and unpredictably by wet etch processing steps. This can degrade both resistor accuracy and matching performance.

Conventional TFR fabrication techniques also require that a stack of materials, which includes thin film, barrier, and metal layers, be patterned and etched to define the length of each resistor. Material stacks such as these typically present a step, which interferes with photolithography by either thinning the photoresist in a poorly controlled manner, or by causing reflections. This adversely affects the ability to accurately define resistor length, and thus further degrades resistor accuracy and matching performance.

SUMMARY OF THE INVENTION

A thin film resistor fabrication method is presented which overcomes the problems noted above, providing TFRs having well-defined lengths and consistent resistivities.

In accordance with one embodiment of the present method, an IC's active devices are fabricated on a substrate. A dielectric layer is deposited over these structures, which protects them from the subsequent process steps required to form the TFRs; the dielectric layer is patterned and etched to provide contacts to the existing devices. A layer of thin film material suitable for the formation of TFRs is deposited next, followed by a barrier layer and a first layer of metal. The thin film, barrier, and first metal layer are patterned and etched to form isolated thin film/barrier/metal stacks wherever a TFR is to be located, and a first level of metal interconnections. The first metal layer is then removed from the TFR stacks, and the barrier layer is patterned and etched to provide respective openings which define the active areas of each of the TFRs.

Because the TFR stacks are isolated from the other IC circuitry, their respective effective electrical potentials are all about equal. This reduces the unpredictable effects of subsequent wet etches that can arise when the potentials are unequal. In addition, by removing the first metal layer prior to etching the TFR openings, a thinner stack is presented, which improves the accuracy with which the TFR lengths can be defined.

In a preferred embodiment, a dielectric layer is deposited over the TFR stacks and existing active devices after the first metal layer is removed, to protect the interconnect metal from corrosion and as an adhesion layer for the patterning of the openings which define resistor length.

Once the TFRs are completed, a dielectric layer is preferably deposited, vias to the first layer of metal are patterned and etched, and a second metal layer is deposited, patterned and etched to provide a second layer of metal interconnections.

Further features and advantages of the invention will be apparent to those skilled in the art from the following detailed description, taken together with the accompanying drawings.

BRIEF DESCRIPTION OF THE DRAWINGS

FIGS. 1a–6a are plan views depicting the fabrication of TFRs in accordance with the present method.

FIGS. 1b–6b are cross-sectional views, corresponding to the plan views of FIGS. 1a–6a, respectively.

FIGS. 7a–10a are plan views depicting additional TFR fabrication steps performed in accordance with a preferred embodiment of the present method.

FIGS. 7b–10b are cross-sectional views, corresponding to the plan views of FIGS. 7a–10a, respectively.

DETAILED DESCRIPTION OF THE INVENTION

A method of fabricating high performance TFRs is illustrated in the process sequence depicted in FIGS. 1a–6a (plan views) and 1b–6b (corresponding cross-sectional views). For clarity, the sequence shows the formation of two TFRs; however, in practice, the described method is likely to be employed to fabricate numerous TFRs with a common set of process steps.

Prior to practicing the present method, an IC's active devices are fabricated. For example, in FIGS. 1a and 1b, substrate 10 supports active devices 12 and 14. A dielectric layer 16, typically oxide, is deposited on the substrate, and is patterned and etched to provide interconnection access to the active devices.

Figure 1A:
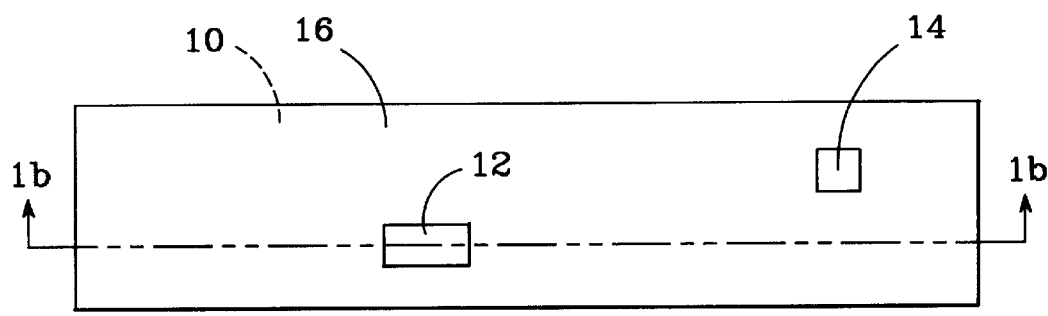
Figure 1B:
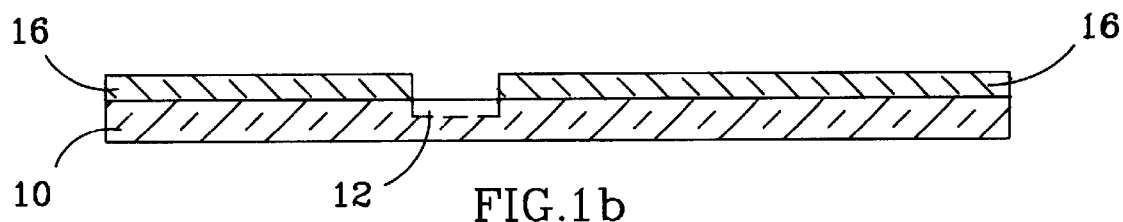
Figure 2A:
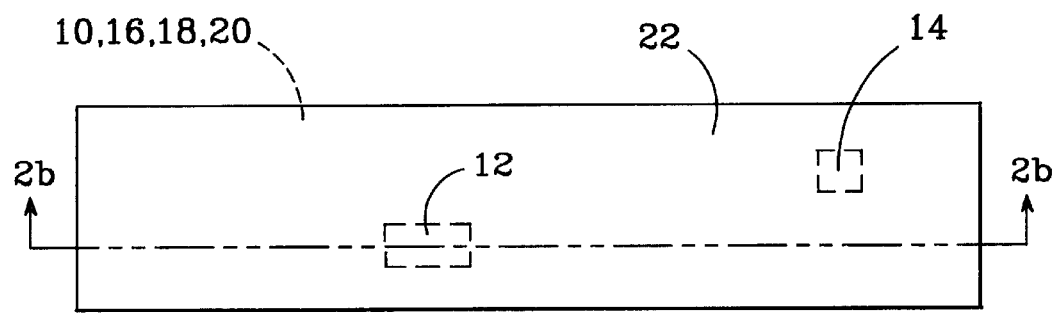
Figure 2B:
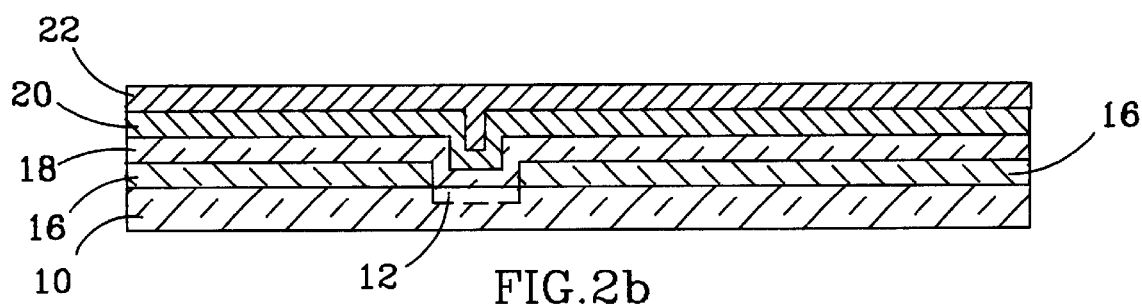

As shown in FIGS. 2a and 2b, a thin film 18 from which the TFRs will be made is deposited on layer 16, followed by a barrier layer 20 and a first metal layer 22. Thin film layer 18 preferably comprises silicon-chromium-carbon ($Si_xCr_yC_z$), and barrier layer 20 is preferably titanium-tungsten (TiW) (preferably containing approximately 15 atomic percent titanium and the balance of the material being tungsten). Metal layer 22 preferably comprises aluminum (Al) (preferably containing 1% copper and no silicon).

Figure 3A:
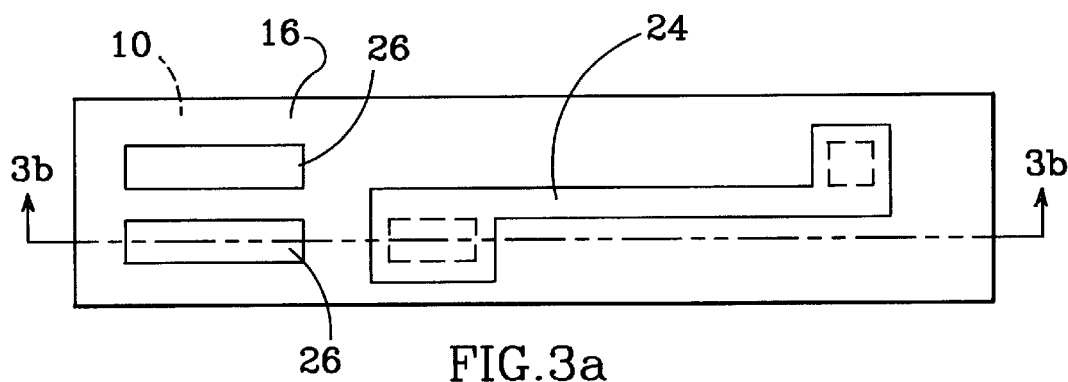
Figure 3B:
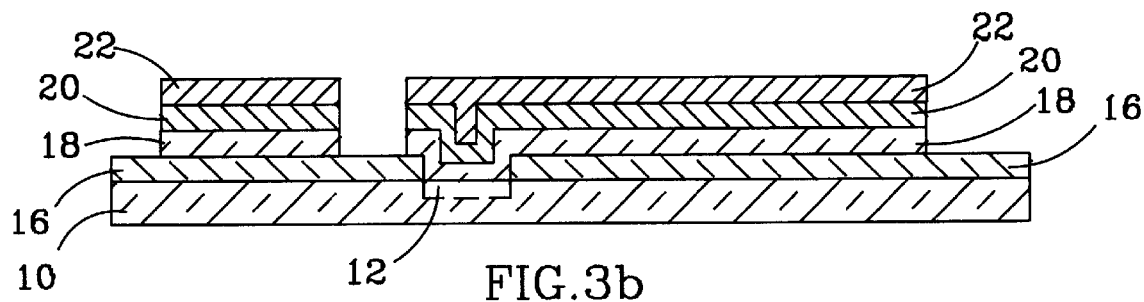

As shown in FIGS. 3a and 3b, the thin film, barrier, and metal layers are patterned using conventional photolithographic techniques, and etched to form a first level of metal interconnections 24, and isolated TFR material stacks 26 where respective TFRs are to be located. This step defines the widths of isolated TFR material stacks 26, and thus of the TFRs they will become.

Because TFR material stacks 26 are isolated from other chip circuitry, they will all be at about the same effective electrical potential. As a result, the aforementioned adverse electrochemical effects which can arise due to unequal potentials are avoided: subsequent processing steps will affect each stack about equally, thereby improving the TFRs' accuracy and matching performance.

Figure 4A:
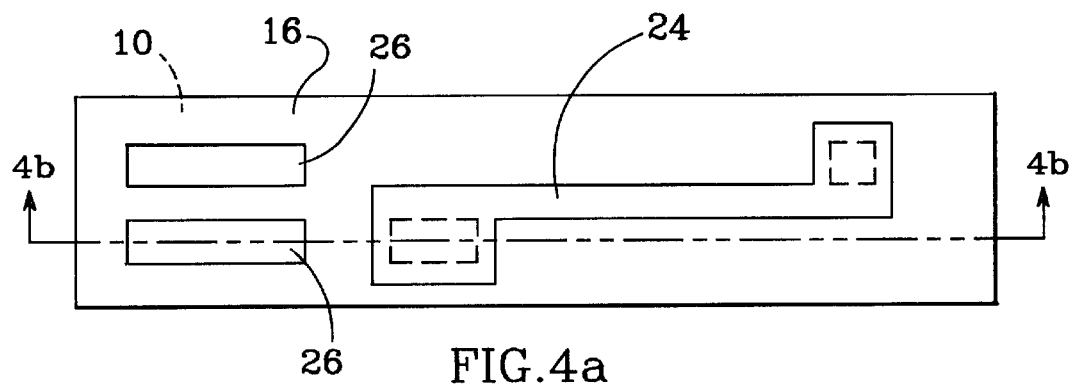
Figure 4B:
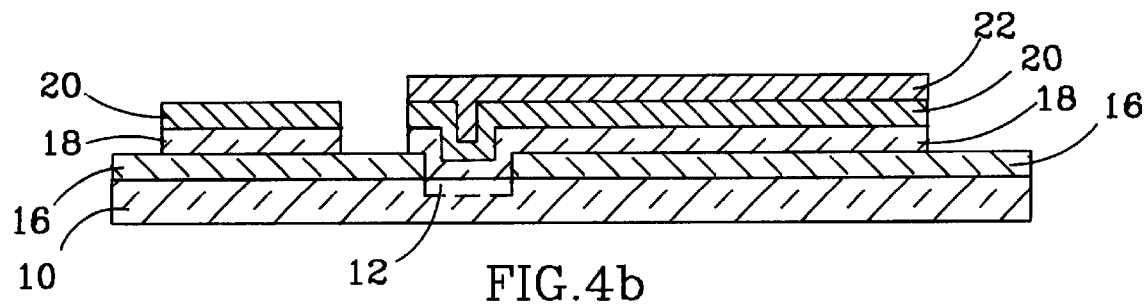

The photoresist used to form interconnections 24 and stacks 26 is removed, preferably with standard dry oxygen plasma stripping, and a second masking pattern is employed which exposes only the areas where isolated TFR material stacks 26 are located. As shown in FIGS. 4a and 4b, metal layer 22 is then removed from stacks 26. This is preferably accomplished with an aggressive phosphoric, acetic and nitric acid (PAN) etchant, which is highly selective to the barrier, thin film, and substrate layers of TFR stacks 26. The use of a highly selective etchant makes extended overetches possible, which helps ensure that all of metal layer 22 is removed from the stacks.

Figure 5A:
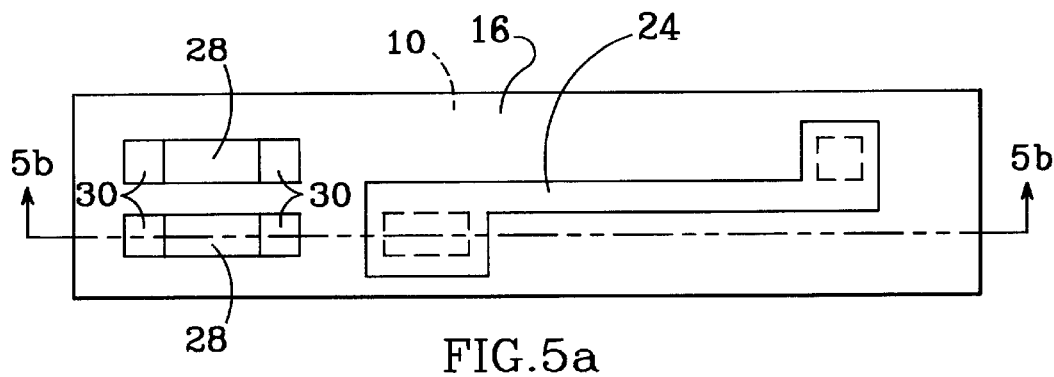
Figure 5B:
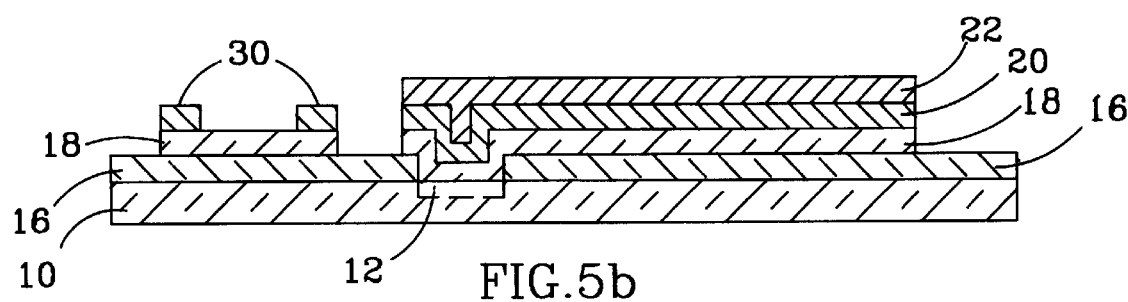

The second masking layer is removed, again preferably using standard dry oxygen plasma stripping. As shown in FIGS. 5a and 5b, a third masking layer is then formed to create the openings 28 which define the active resistor areas, and thereby establish the lengths of each TFR. The openings are created by etching barrier layer 20, preferably with warm $H_2O_2$; endcaps 30 are left at the ends of each resistor for connection to other chip circuitry (discussed below in connection with FIGS. 6a and 6b). Removing the final photoresist layer, preferably using a standard wet strip chemistry, completes the fabrication of the TFRs and the first metal interconnection layer.

By using the second masking step to remove metal layer 22 from the TFR stacks, the present method enhances resistor accuracy and matching performance. Metal layer 22 is typically thicker than any of the other layers, and thus removing layer 22 leaves a much thinner stack. A thicker stack which presents a step will interfere with photolithography, by either thinning the photoresist in a poorly-controlled manner, or by causing reflections. These consequences are largely avoided by removing metal layer 22 and thinning the stack, which improves control of the TFRs' dimensions and thus their accuracy and matching performance. Also, because it is much easier to control the barrier material etch than it is an etch of the first metal layer, control of TFR length is further enhanced by removing layer 22.

Figure 6A:
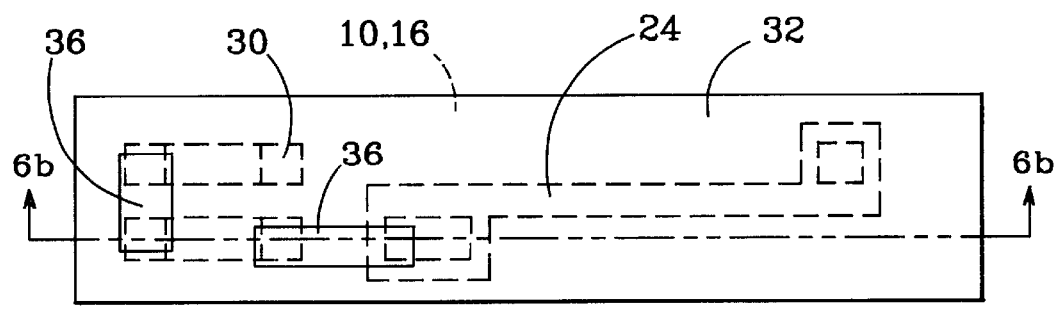
Figure 6B:
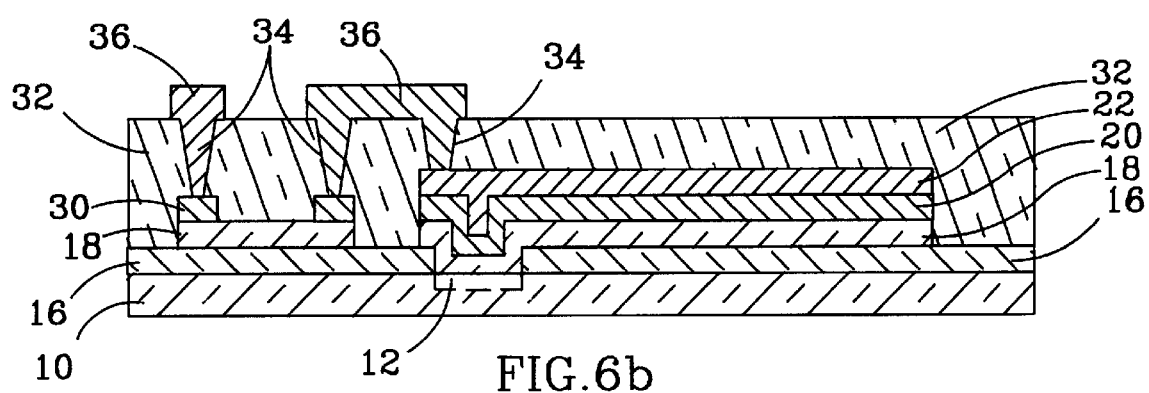
Figure 7A:
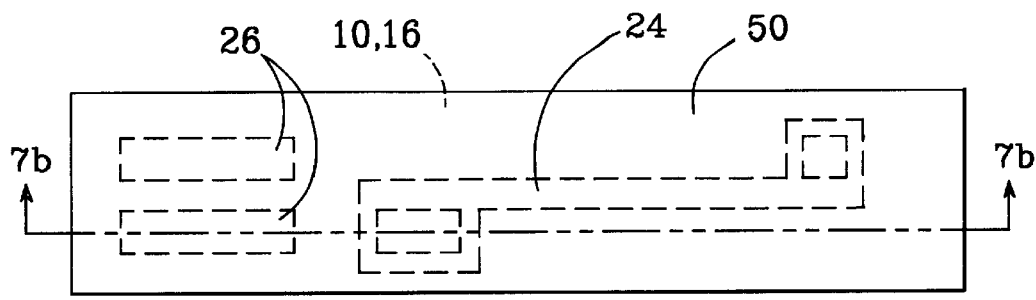
Figure 7B:
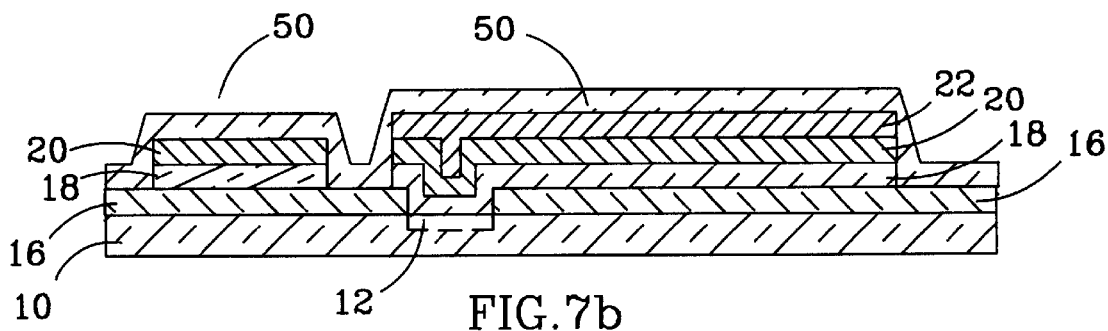

With the TFRs completed, connections to the resistors and first metal interconnection layer are typically effected as follows (as shown in FIGS. 6a and 6b): an intermetal dielectric layer 32 is deposited over the TFRs and first metal interconnections. Vias 34 are patterned and etched in layer 32 as necessary to provide access to the TFRs' endcaps 30 and the first metal interconnections. Then, a second metal layer 36 is deposited, patterned and etched on dielectric layer 32 to provide a second metal interconnection layer and connections to the buried features.

A preferred embodiment of the present method is illustrated in FIGS. 1–4 and 7–10, with the steps shown in FIGS. 7–10 performed after those shown in FIGS. 1–4, instead of those shown in FIGS. 5 and 6. As shown in FIGS. 7a and 7b, an oxide layer 50 is deposited on the TFRs and first metal interconnections after metal layer 22 has been removed from isolated material stacks 26. Oxide layer 50 is preferably plasma-enhanced chemical vapor deposition (PECVD) oxide, having a typical thickness of about 200–4000Å. Oxide layer 50 serves as a capping layer which protects the first layer metal interconnections from corrosion, and as an adhesion layer for the patterning of the TFRs' active openings.

Figure 8A:
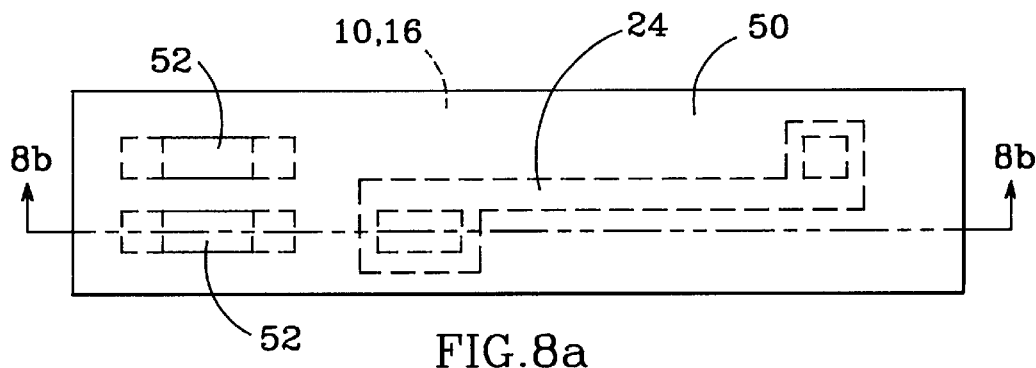
Figure 8B:
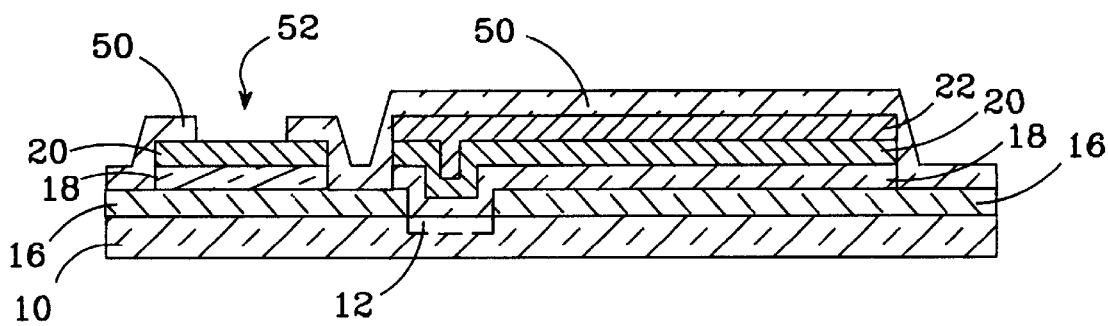
Figure 9A:
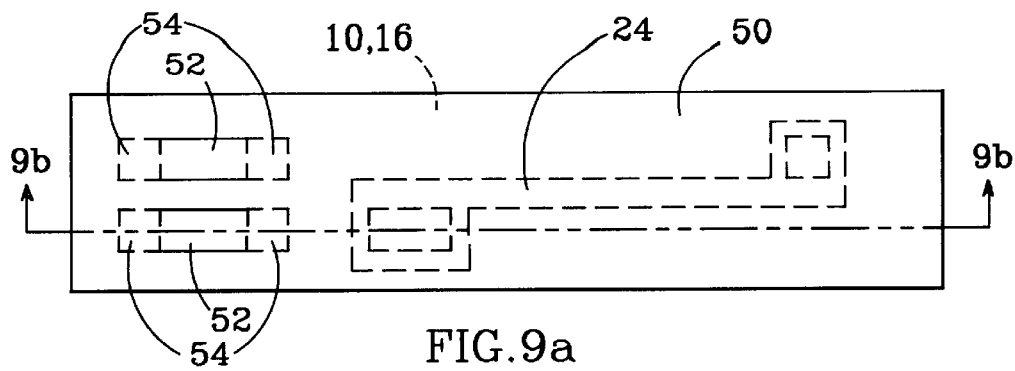
Figure 9B:
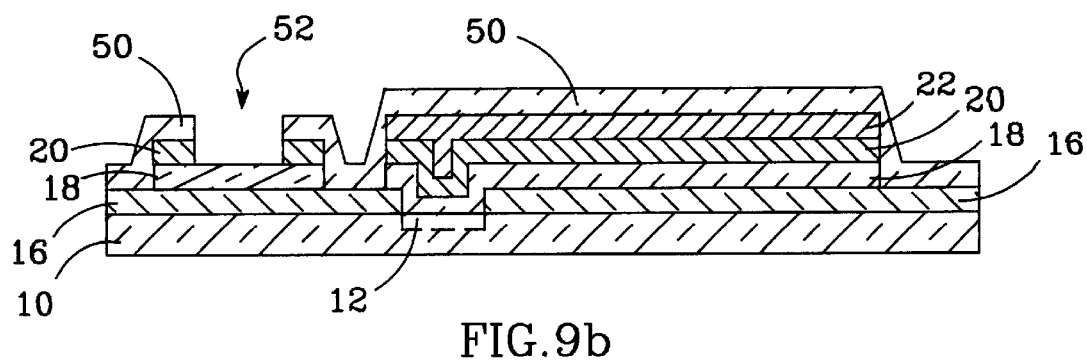

As shown in FIGS. 8a and 8b, oxide layer 50 is patterned and etched, using either a wet or dry etch, to define active openings 52 for the TFRs. Barrier layer 20 is then etched, preferably with warm $H_2O_2$, to complete the definition of the TFRs' active openings 52 (FIGS. 9a and 9b). Endcaps 54 are left at the ends of each resistor for connection to other chip circuitry (discussed below in connection with FIGS. 10a and 10b). Removing the final photoresist layer, preferably using a standard wet strip chemistry, completes the fabrication of the TFRs and the first metal interconnect layer.

Figure 10A:
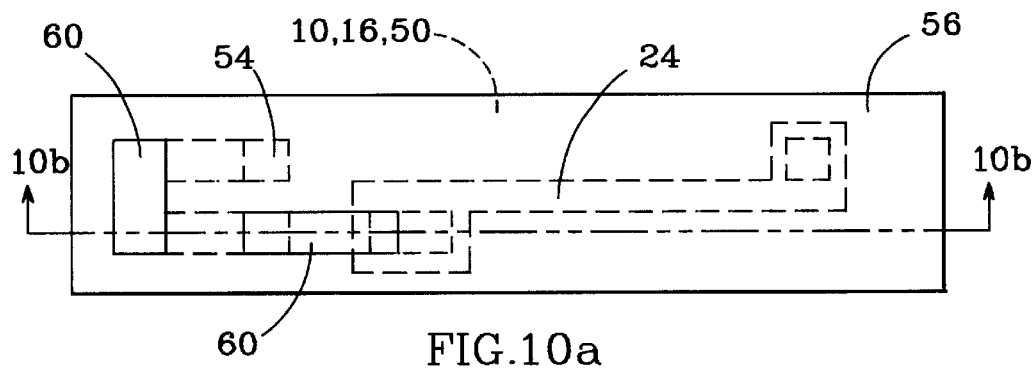
Figure 10B:
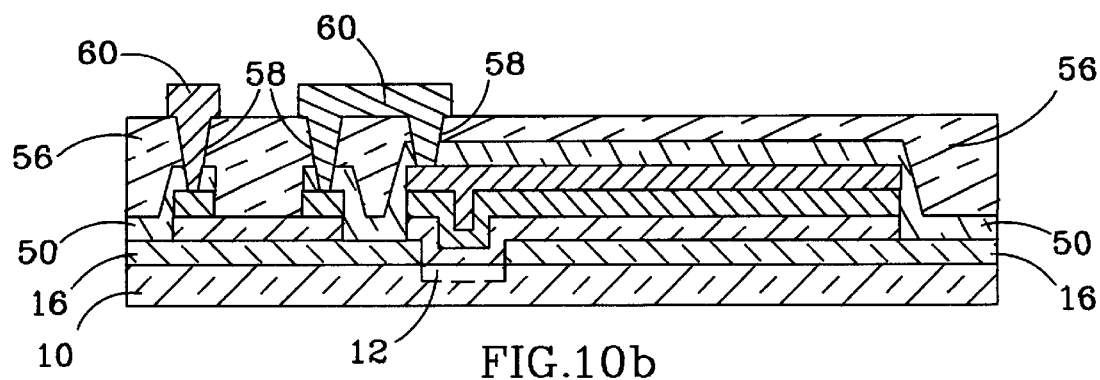

With the TFRs completed, connections to the resistors and first metal interconnection layer are typically effected as follows (as shown in FIGS. 10a and 10b): an intermetal dielectric layer 56 is deposited over the TFRs and first metal interconnections. Vias 58 are patterned and etched in layer 56 as necessary to provide access to the TFRs' endcaps 54 and the first metal interconnections. Then, a second metal layer 60 is deposited, patterned and etched on dielectric layer 56 to provide a second metal interconnect layer and connections to the buried features.

Substrate 10 is typically silicon, and the IC's active devices are completed prior to commencing the present method. Dielectric layer 16 is preferably PECVD oxide, having a thickness of 2000–20,000Å. The preferred $Si_xCr_yC_z$ thin film material 18 is preferably sputter deposited and optionally annealed, and has a sheet resistance of 50–3000 ohms/square. The preferred TiW barrier material 20 is preferably sputter deposited after an appropriate surface cleaning procedure, and has a thickness of 500–3000Å.

Intermetal dielectric layer 32 is preferably PECVD oxide, planarized using either a spin-on glass etch back step or with chemical-mechanical polishing (CMP).

Note that the present process does not preclude the use of an alternative metal process, such as using copper as the interconnect metal, or using dual-damascene metal patterning. Though TiW and Al alloys are identified as preferred metals, the present method is not limited to these materials.

While particular embodiments of the invention have been shown and described, numerous variations and alternate embodiments will occur to those skilled in the art. Accordingly, it is intended that the invention be limited only in terms of the appended claims.

We claim:

1. A method of fabricating thin film resistors (TFRs) at predetermined locations on an integrated circuit (IC) substrate, comprising:

depositing a first dielectric layer over existing active devices on an IC substrate, patterning and etching said first dielectric layer to provide interconnection access to said existing active devices, depositing a layer of thin film material on said first dielectric layer, depositing a barrier layer on said thin film layer, depositing a first layer of metal on said barrier layer, patterning and etching said first layer of metal, said barrier layer, and said thin film material to form an isolated thin film/barrier/metal material stack at each predetermined TFR location and a first level of metal interconnections for said IC, removing the first layer of metal from each of said isolated TFR material stacks, and patterning and etching the barrier layer of each of said isolated TFR material stacks to provide respective openings which define the active areas of each of said TFRs.

2. The method of claim 1, wherein said thin film material comprises silicon-chromium-carbon ($Si_xCr_yC_z$).

3. The method of claim 1, wherein said barrier layer comprises titanium-tungsten (TiW).

4. The method of claim 1, wherein said first layer of metal comprises aluminum (Al).

5. The method of claim 1, wherein said first layer of metal is removed with an etchant comprising phosphoric, acetic and nitric (PAN) acids.

6. The method of claim 1, wherein said barrier layer is etched with an etchant comprising $H_2O_2$.

7. The method of claim 1, further comprising:
- depositing, after said patterning and etching of the barrier layer, a second dielectric layer over said TFRs, said first level of metal interconnections, and said existing active devices,
- pattering and etching vias to said first level of metal interconnections and said TFRs,
- depositing a second layer of metal on said second dielectric layer, and
- patterning and etching said second layer of metal to provide a second level of metal interconnections and connections to said TFRs and said first level of metal interconnections.

8. The method of claim 1, further comprising:
- depositing, after said removing of said first layer of metal, a second dielectric layer over said isolated TFR material stacks, said first level of interconnections, and said existing active devices, and
- patterning and etching said second dielectric layer to provide respective openings which define the active areas of each of said TFRs.

9. The method of claim 8, wherein said second dielectric layer is plasma-enhanced chemical vapor deposition (PECVD) oxide.

10. A method of fabricating thin film resistors (TFRS) at predetermined locations on an integrated circuit (IC) substrate, comprising:
- depositing a first dielectric layer over existing active devices on an IC substrate,
- patterning and etching said first dielectric layer to provide interconnection access to said existing active devices,
- depositing a layer of thin film material on said first dielectric layer,
- depositing a barrier layer on said thin film layer,
- depositing a first layer of metal on said barrier layer,
- patterning and etching said first layer of metal, said barrier layer, and said thin film material to form an isolated thin film/barrier/metal material stack at each predetermined TFR location and a first level of metal interconnections for said IC,
- removing the first layer of metal from each of said isolated TFR material stacks,
- depositing a second dielectric layer over said isolated TFR material stacks, said first level of metal interconnections, and said existing active devices,
- patterning and etching said second dielectric layer to provide respective openings which define the active areas of each of said TFRs,
- etching said barrier layer to provide respective openings which further define the active areas of each of said TFRs,
- depositing a third dielectric layer over said TFRs, said first level of metal interconnections, and said existing active devices,
- pattering and etching vias to said first level of metal interconnections and said TFRs,
- depositing a second layer of metal on said third dielectric layer, and
- patterning and etching said second layer of metal to provide a second level of metal interconnections and connections to said TFRs and said first level of interconnections.

11. The method of claim 10, wherein said thin film material comprises silicon-chromium-carbon ($Si_xCr_yC_z$).

12. The method of claim 10, wherein said first layer of metal is removed with an etchant comprising phosphoric, acetic and nitric (PAN) acids.

13. The method of claim 10, wherein said second dielectric layer is plasma-enhanced chemical vapor deposition (PECVD) oxide.

* * * * *